United States Patent [19]

Kirby

[11] Patent Number: 4,903,380
[45] Date of Patent: Feb. 27, 1990

[54] RETAINING PIN

[75] Inventor: Kenneth D. Kirby, Scottsdale, Ariz.

[73] Assignee: Motorola, Inc., Schaumburg, Ill.

[21] Appl. No.: 317,417

[22] Filed: Mar. 1, 1989

[51] Int. Cl.$^4$ .............................................. A47B 21/00
[52] U.S. Cl. ........................................ 24/453; 24/297; 411/908
[58] Field of Search .................. 24/453, 297; 411/508, 411/509, 907, 908, 913, 451

[56] References Cited

U.S. PATENT DOCUMENTS

| 1,894,715 | 1/1933 | Smith | 411/508 |
| 3,029,486 | 4/1962 | Raymond | 411/908 |
| 3,181,411 | 5/1965 | Mejlso | 411/508 |
| 3,485,133 | 12/1969 | Rapata | 411/508 |
| 3,897,967 | 8/1975 | Barenyi | 24/297 |
| 4,279,190 | 7/1981 | Hummel | 411/451 |
| 4,295,258 | 10/1981 | Penn et al. | |
| 4,485,531 | 12/1984 | Murphy | 24/297 |

FOREIGN PATENT DOCUMENTS

| 1450901 | 3/1969 | Fed. Rep. of Germany | 24/297 |
| 1800502 | 5/1970 | Fed. Rep. of Germany | 24/297 |
| 1222697 | 6/1960 | France | 24/297 |
| 0882898 | 11/1961 | United Kingdom | 24/297 |
| 0884123 | 12/1961 | United Kingdom | 24/297 |

Primary Examiner—Victor N. Sakran
Attorney, Agent, or Firm—Joe E. Barbee

[57] ABSTRACT

A retaining pin useful for retaining semiconductor packages within a carrying sleeve has a solid cylindrical shank and a spherical head. The shank has a shoulder that commences a predetermined distance below the head and tapers gradually to a truncated end.

7 Claims, 1 Drawing Sheet

RETAINING PIN

BACKGROUND OF THE INVENTION

This invention relates, in general, to retaining pins, and more particularly, to a retaining pin useful for retaining semiconductor devices within a carrying sleeve.

Many different types of packaged semiconductor devices are shipped in carrying sleeves. Carrying sleeves are typically made of plastic and have a cross-sectional configuration which conforms to the particular semiconductor package carried within the sleeve. The sleeve is open at both ends and therefore requires some kind of means to retain the semiconductor packages within the sleeve. The means must be easily removable in order to empty the sleeve. A common retaining means has been a pin which is inserted through holes in the top and bottom of the sleeve. There are many configurations of pins; however, the pins have been found difficult to insert in the holes and also cause damage to the sleeve itself. A pin that is difficult to insert will normally damage the hole in the sleeve thereby pushing the edges of the hole into the sleeve itself. This causes an obstruction within the sleeve so that the semiconductor packages are not easily inserted into or removed from the sleeve. As a result automated equipment designed to load and empty the sleeves becomes jammed and requires operator intervention. By now it should be appreciated that it would be desirable to provide an improved retaining pin.

Accordingly, it is an object of the present invention to provide a new and improved retaining pin.

Another object of the present invention is to provide a gentler and kinder retaining pin which does not damage a carrying sleeve during the insertion or removal of the retaining pin.

SUMMARY OF THE INVENTION

The above and other objects and advantages of the present invention are achieved by providing a retaining pin having a semi-spherical head and a cylindrical shank. The cylindrical shank has a first end which meets with the head and a second truncated end. A short distance from the first end, the shank has a shoulder which tapers in a decreasing manner to the second end. The distance from the shoulder to the head accommodates a wall thickness of a carrying sleeve into which the retaining pin is inserted. The carrying sleeve will have a top surface and a bottom surface with a hole in the top surface and a hole in the bottom surface. The retaining pin is inserted into the hole in the top surface. The head of the retaining pin rests on the top surface and the second end of the shank fits into the hole on the bottom surface.

DETAILED DESCRIPTION OF THE DRAWINGS

Figure 1:
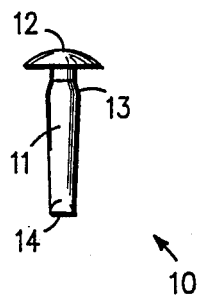
FIG. 1 is a side view of the retaining pin of the present invention.

FIG. 1 illustrates a retaining pin 10 having a shank 11 and a head 12. Head 12 is semi-spherical in configuration. Shank 11 has a solid cylindrical shape with a shoulder 13 commencing a short distance below head 12. Shoulder 13 tapers gradually to bottom 14 of shank 11. In a preferred embodiment, end 14 has the same diameter as the top of shank 11 which mates with head 12. Retaining pin 10 can be made from any suitable rigid plastic such as nylon, PVC, or the like.

Retaining pin 10 must not be soft enough to be deformed or scraped by the hole into which it is inserted. At the same time shoulder 13 must be gradual enough to allow gentle entry and exiting of the hole into which it is inserted. Bottom 14 of pin 10 has a cone shaped recess to accommodate an automated tool which is used to push retaining pin 10 out of the holes into which it is inserted. Thus, bottom 14 has a recessed indentation to facilitate the removal of pin 10 from carrying sleeve 20. Retaining pin 10 must be rigid enough to render pin 10 reusable.

Figure 2:
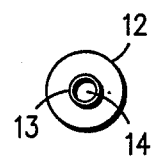
FIG. 2 is and end view of the retaining pin of FIG. 1.

FIG. 2 is a bottom view of retaining pin 10. This bottom view shows the cone shaped recess in bottom 14. Also seen is shoulder 13 and spherical head 12. Head 12 is semispherical having a flat bottom and a rounded top which meets the flat bottom in a manner that forms very gradual edges at the perimeter of head 12.

Figure 3:
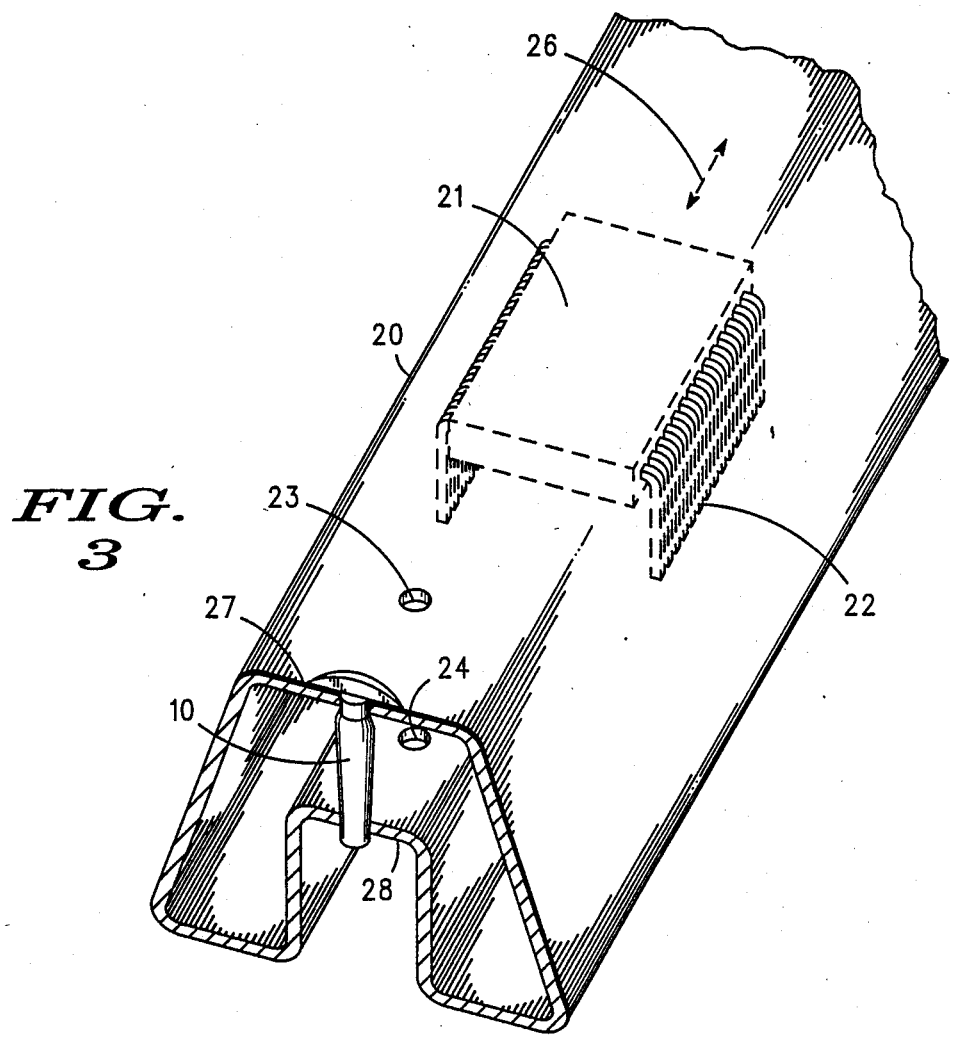
FIG. 3 shows a retaining pin and a carrying sleeve in which the retaining pin is used.

FIG. 3 illustrates a portion of a carrying sleeve 20 in which retaining pin 10 is used. A cross-section of one end of carrying sleeve 20 is taken right at the holes into which retaining pin 20 is inserted. Adjacent to retaining pin 20 is an additional set of holes illustrated as top hole 23 and bottom hole 24. Top hole 23 is made in top surface 27 while bottom hole 24 is made in bottom surface 28.

Carrying sleeve 20 is configured to accommodate semiconductor packages or devices 21. Although only one device 21 is shown in sleeve 20, it will be understood that sleeve 20 can hold a plurality of devices 21. The device 21 illustrated has a plurality of leads 22. Semiconductor packages 21 move in a longitudinal direction along the axis of carrying sleeve 20 as illustrated by arrow 26. Only one semiconductor package 21 is illustrated in order to simplify the drawing. When retaining pin 10 is removed semiconductor packages 21 can be removed from sleeve 20. The sleeve can be refilled with semiconductor packages once the packages are marked or tested. Retaining pin 10 is then reinserted into the holes of carrying sleeve 20. Retaining pin 10 is configured to provide gentle entry into carrying sleeve 20 to prevent tearing or deforming sleeve 20. If sleeve 20 is deformed by retaining pin 10 then semiconductor packages 21 cannot be easily removed or inserted into carrying sleeve 20 since the deformation will protrude into the cavity of sleeve 20 and impede free and easy movement of semiconductor packages 21 within the cavity. Retaining pin 10 is a solid pin which is easier and cheaper to manufacturer than retaining pins that are resilient or configured to be easily deformable. If retaining pin 10 is made from a material which is too soft then carrying sleeve 20 will tend to shave material from the pin which will damage retaining pin 10 and render the pin useless. The rounded head of retaining pin 10 provides a snug fit to top surface 27 and prevents head 12 of retaining pin 10 from snagging or hanging up on other carrying sleeves.

By now it should be appreciated that there has been provided a gentle retaining pin which prevents deforming a carrier sleeve in which the pin is to be used. The retaining pin is a solid pin which is easier and cheaper to manufacture.

I claim:

1. A retaining pin for insertion into a first round hole in alignment with a second round hole which is spaced apart from the first round hole, comprising: a cylindrical shank having a first end and a second end, the first end being truncated and the shank being tapered toward the second end up to a predetermined distance from the second end to form a gentle shoulder before reaching the second end wherein the predetermined distance is such that the shoulder can pass through only the first round hole; a semi-spherical head formed on the second end of the shank having a flat bottom joining the shank and rising gradually to peak of top head to provide the spherical head.

2. The retaining pin of claim 1 wherein the first end and the second end of the shank are substantially same diameter.

3. The retaining pin of claim 1 wherein the first end has a recessed indentation in its tip to facilitate removal of the retaining pin from the carrying sleeve.

4. A retaining pin for retaining semiconductor devices within a carrying sleeve wherein the carrying sleeve has circular holes in a top and a bottom surface for receiving the retaining pin and the top and bottom surfaces are distanced from each other, the retaining pin having a solid cylindrical shank with a semi-spherical head wherein the semispherical head tapers continuously from its apex to its bottom, and the shank has a first end joining the spherical head and a gentle shoulder a predetermined distance below the spherical head wherein the predetermined distance is less than the distance between the top and bottom surfaces; the shank having a second end, and a taper from the shoulder to the second end.

5. The retaining pin of claim 4 wherein the second end has a flat bottom and a conical recess in the flat bottom in axial alignment with the cylindrical shank.

6. The retaining pin of claim 4 wherein the predetermined distance between the semi-spherical head and the shoulder is large enough to accommodate thickness of the top surface of the carrying sleeve.

7. A reusable pin for retaining semiconductor devices within a carrying sleeve, the carrying sleeve having a top of a predetermined thickness, comprising: a head; a solid shank attached to the head and having a constant diameter for a distance below the head wherein the distance is substantially equal to the thickness of the top, the solid shank then having a gentle shoulder which tapers in a decreasing manner to an end distal from the head, wherein the end has a bottom which has a concave depression that is useful for removing the retaining pin from the carrying sleeve.

* * * * *